United States Patent
McChesney et al.

(10) Patent No.: US 9,530,656 B2
(45) Date of Patent: Dec. 27, 2016

(54) TEMPERATURE CONTROL IN RF CHAMBER WITH HEATER AND AIR AMPLIFIER

(71) Applicant: Lam Research Corporation, Fremont, CA (US)

(72) Inventors: Jon McChesney, Sacramento, CA (US); Alex Paterson, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 693 days.

(21) Appl. No.: 13/851,793

(22) Filed: Mar. 27, 2013

(65) Prior Publication Data

US 2013/0228283 A1    Sep. 5, 2013

Related U.S. Application Data

(63) Continuation-in-part of application No. 13/292,649, filed on Nov. 9, 2011.

(Continued)

(51) Int. Cl.
*H01L 21/306* (2006.01)
*C23C 16/00* (2006.01)
(Continued)

(52) U.S. Cl.
CPC ..... *H01L 21/3065* (2013.01); *H01J 37/32082* (2013.01); *H01J 37/32119* (2013.01); *H01J 37/32238* (2013.01); *H01J 37/32522* (2013.01)

(58) Field of Classification Search
CPC  H01J 37/321; H01J 37/3211; H01J 37/32119;
H01J 37/32128; H01J 37/32137; H01J 37/32146; H01J 37/32155; H01J 37/32165; H01J 37/32174; H01J 37/32183
(Continued)

(56) References Cited

U.S. PATENT DOCUMENTS 5,690,050 A    11/1997    Doi
6,024,826 A  *  2/2000    Collins ............. H01J 37/32082
                                                          118/723 E
(Continued)

FOREIGN PATENT DOCUMENTS

CN    101409227 A    4/2009
EP    0808917 A1    11/1997

OTHER PUBLICATIONS

The First Office Action issued Dec. 16, 2015.

*Primary Examiner* — Luz Alejandro Mulero
(74) *Attorney, Agent, or Firm* — Martine Penilla Group, LLP

(57) ABSTRACT

Systems, methods, and computer programs are presented for controlling the temperature of a window in a semiconductor manufacturing chamber. One apparatus includes an air amplifier, a plenum, a heater, a temperature sensor, and a controller. The air amplifier is coupled to pressurized gas and generates, when activated, a flow of air. The air amplifier is also coupled to the plenum and the heater. The plenum receives the flow of air and distributes the flow of air over a window of the plasma chamber. When the heater is activated, the flow of air is heated during processing, and when the heater is not activated, the flow of air cools the window. The temperature sensor is situated about the window of the plasma chamber, and the controller is defined to activate both the air amplifier and the heater based on a temperature measured by the temperature sensor.

16 Claims, 12 Drawing Sheets

Related U.S. Application Data

(60) Provisional application No. 61/544,799, filed on Oct. 7, 2011.

(51) Int. Cl.
*H01L 21/3065* (2006.01)
*H01J 37/32* (2006.01)

(58) Field of Classification Search
USPC .............. 118/723 I, 723 IR, 723 AN, 723 R; 156/345.48, 345.49; 315/111.51
See application file for complete search history.

(56) References Cited

U.S. PATENT DOCUMENTS

| | | | |
|---|---|---|---|
| 6,326,597 B1 * | 12/2001 | Lubomirsky | H01L 21/67248 118/723 R |
| 6,367,410 B1 * | 4/2002 | Leahey | H01L 21/67103 118/58 |
| 6,414,648 B1 * | 7/2002 | Holland | H01J 37/321 118/723 I |
| 2004/0118520 A1 | 6/2004 | Nakayama et al. | |
| 2011/0168673 A1 | 7/2011 | Nishimoto | |

\* cited by examiner

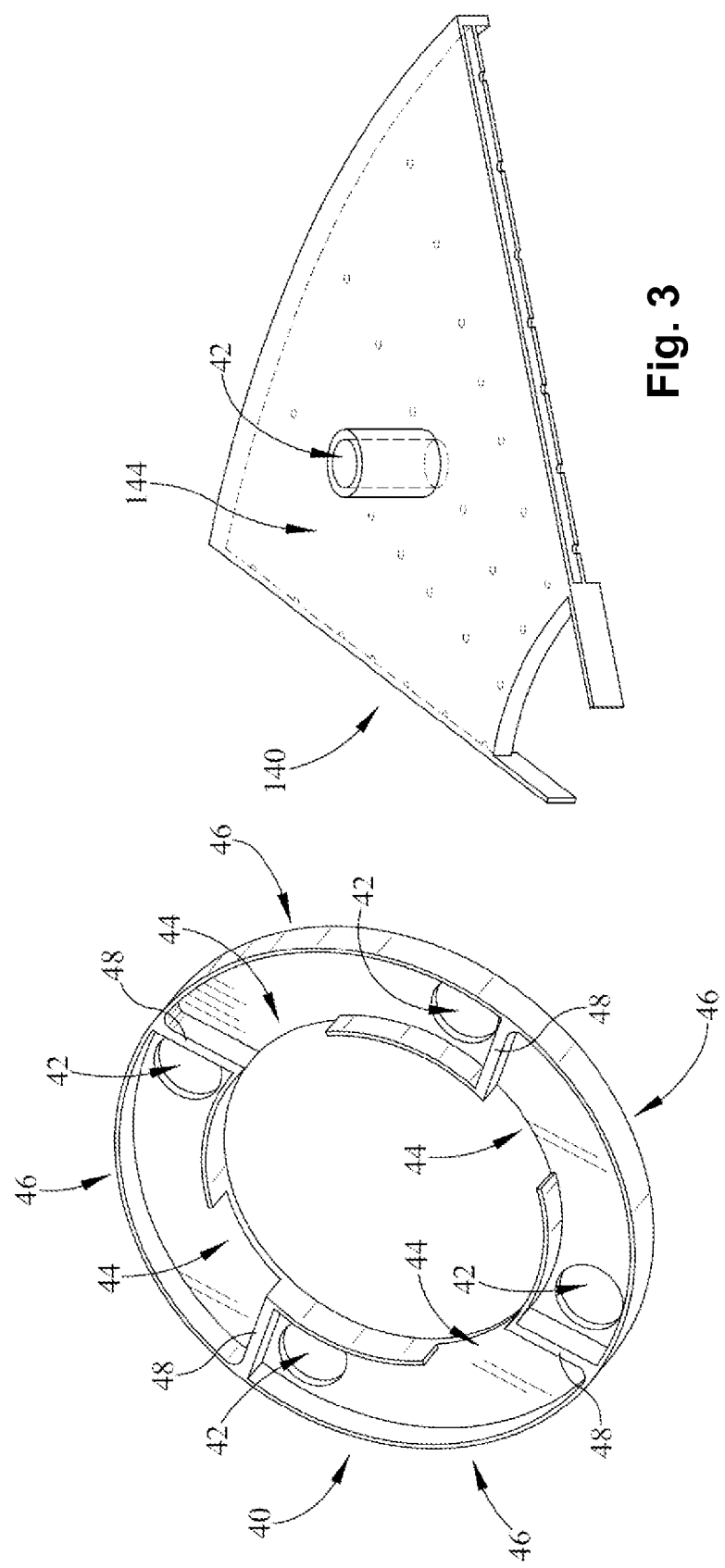

TEMPERATURE CONTROL IN RF CHAMBER WITH HEATER AND AIR AMPLIFIER

CLAIM OF PRIORITY

This application is a Continuation In Part Application and claims priority from U.S. application Ser. No. 13/292,649, entitled "Systems for Cooling RF Heated Chamber Components", filed on Nov. 9, 2011, which claims priority from U.S. Provisional Application No. 61/544,799, filed Oct. 7, 2011, entitled "Systems for Cooling RF Heated Chamber Components," all of which are incorporated herein by reference.

BACKGROUND

1. Field of the Invention

The present embodiments relate to systems, methods, and computer programs for controlling temperature in a semiconductor manufacturing device.

2. Description of the Related Art

Plasma processing devices can be utilized to etch material away from a substrate formed from, for example, a semiconductor or glass. Plasma processing devices may contain a vacuum chamber that encloses plasma processing gases, which can be ionized and transformed into plasma. For example an energized source (Radio Frequency (RF), microwave or other source) can apply energy to the process gas to generate the plasma. In some plasma processing devices, the energy can be transmitted through a dielectric window that is formed through the vacuum chamber. Accordingly, the dielectric window can be subjected to heating induced by the electromagnetic energy. Moreover, the heating can be localized to specific regions of the dielectric window due to variations in electromagnetic energy caused by process conditions. There can be two sources of heating of the dielectric window. First, the dielectric properties of the window (tangent-δ) may result in the direct absorption of Radio Frequency (RF) or microwave power. Second, the plasma created by the energized source can indirectly heat the window. Moreover, the heating can be evenly distributed across the dielectric window or localized to specific regions of the window due to the design of the source (antenna construction, etc) and plasma conditions.

Heat energy can be removed from dielectric windows passively (i.e. no cooling device) or with a cooling device such as a liquid cooling system or a fan cooling system. Liquid cooling systems can be efficient but are more expensive than passive cooling or fan cooling systems. Moreover, liquid cooling systems are more difficult to implement in an environment subjected to electromagnetic energy. For example liquid cooling can cause localized cooling resulting in thermal gradients and thermal cracking. The dielectric properties for the liquid are different to the surrounding ceramic resulting in non-uniform transmission of the RF power. For example, the liquid may be conducting which would result in the dissipation of RF power within the liquid. The liquid may be subject to nucleation and can be difficult to contain within the cooling system.

Fan cooling systems can be utilized for cooling of dielectric windows such as, for example, via convection. However, fan cooling systems can be inefficient and difficult to apply to localized regions of relatively high heat load induced by the energized source in a dielectric window. Specifically, fan cooling systems suitable for use with plasma processing devices are ineffective for heat removal when subjected to high back pressure.

Accordingly, a need exists for alternative devices for cooling dielectric windows of plasma processing devices. It is in this context that embodiments arise.

SUMMARY

Systems, methods, and computer programs are presented for managing the temperature of a window in a semiconductor manufacturing chamber. It should be appreciated that the present embodiments can be implemented in numerous ways, such as a method, an apparatus, a system, a device, or a computer program on a computer readable medium. Several embodiments are described below.

In one embodiment, an apparatus includes an air amplifier, a plenum, a heater, a temperature sensor, and a controller. The air amplifier is coupled to pressurized gas (e.g., compressed air) and generates, when activated, a flow of air. The air amplifier is also coupled to the plenum and the heater. The plenum receives the flow of air and distributes the flow of air over a window of the plasma chamber. When the heater is activated, the flow of air is heated during processing. The temperature sensor is situated about the window of the plasma chamber, and the controller is defined to activate the air amplifier and/or the heater based on a temperature measured by the temperature sensor.

In another embodiment, a method for processing semiconductor equipment is provided. The method includes operations for first activating an air amplifier defined to generate a flow of air, and for first activating a heater coupled to the air amplifier to heat the flow of air. The flow of air is distributed over a window of a plasma chamber. Further, the method includes another operation for deactivating the air amplifier and the heater when a temperature of the window reaches a first predetermined value. The method includes another operation for second activating the air amplifier, without activating the heater, to cool the window when the temperature reaches a second predetermined value. The air amplifier is then activated when the temperature is below a third predetermined value. In one embodiment, the operations of the method are executed by a processor.

In yet another embodiment, a semiconductor manufacturing apparatus includes a plurality of air amplifiers, a plenum, a plurality of heaters, one or more temperature sensors, and a controller. The plurality of air amplifiers are coupled to pressurized gas, each air amplifier generating a flow of air when activated. The plenum includes a plurality of sections, each section coupled to a respective air amplifier, where each section receives the flow of air from the respective air amplifier and each section distributes the flow of air over a window of a plasma chamber. Each heater is coupled to the respective air amplifier, such that the flow of air is heated when each heater is activated during processing in the plasma chamber. The one or more temperature sensors are situated about the window of the plasma chamber, and the controller is defined to activate each air amplifier and to activate each heater based on one or more temperatures measured by the one or more temperature sensors.

Other aspects will become apparent from the following detailed description, taken in conjunction with the accompanying drawings.

BRIEF DESCRIPTION OF THE DRAWINGS

The embodiments may best be understood by reference to the following description taken in conjunction with the accompanying drawings.

FIG. 2 schematically depicts a plenum according to one or more embodiments shown and described herein.

FIG. 3 schematically depicts a plenum segment according to one or more embodiments shown and described herein.

DETAILED DESCRIPTION

The following embodiments describe a method and apparatus for controlling the temperature in a semiconductor manufacturing apparatus, and more specifically, for controlling the temperature of the dielectric window in the RF chamber.

It will be apparent, that the present embodiments may be practiced without some or all of these specific details. In other instances, well known process operations have not been described in detail in order not to unnecessarily obscure the present embodiments.

Figure 1:
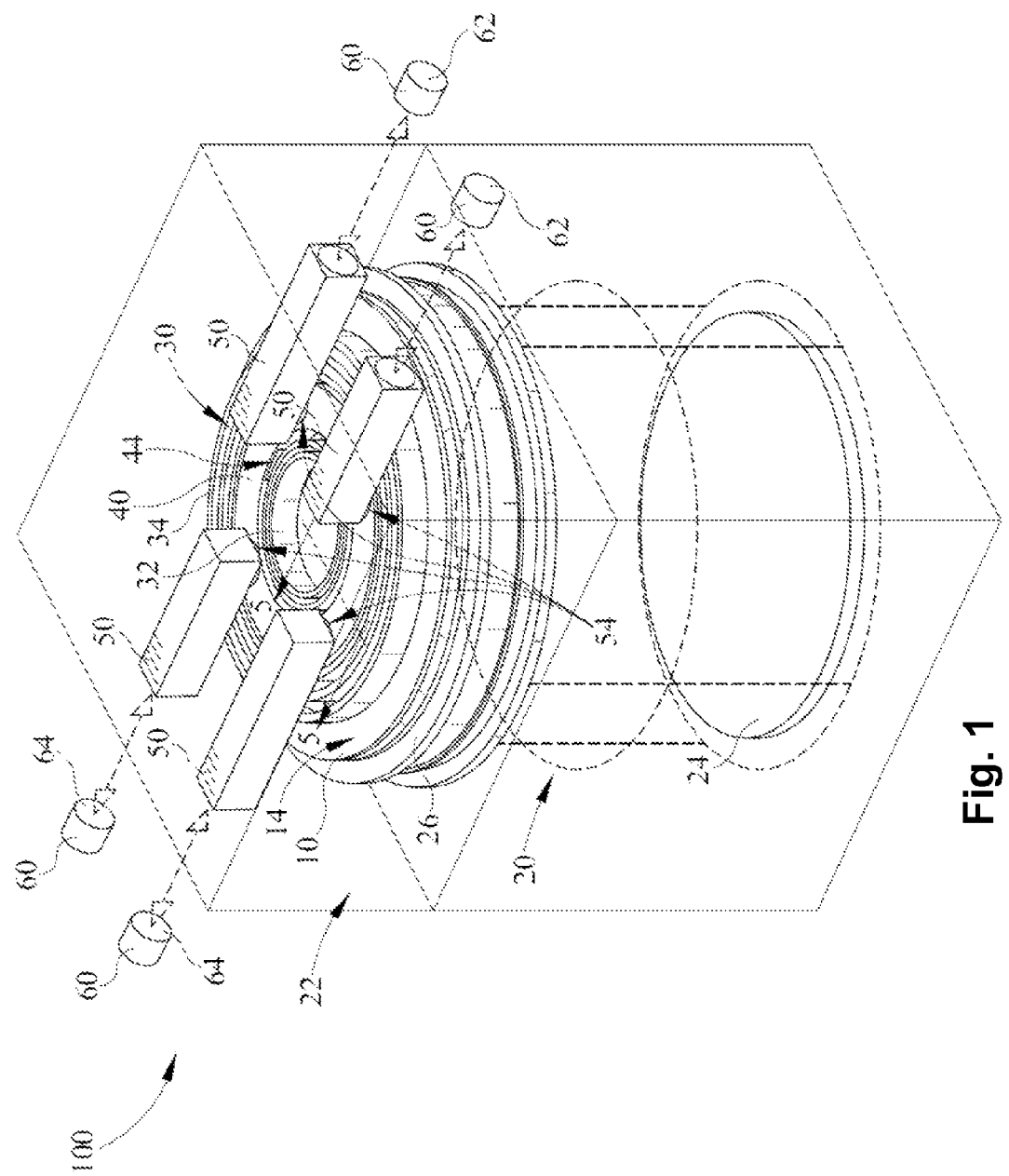
FIG. 1 schematically depicts a plasma processing device according to one or more embodiments shown and described herein.

FIG. 1 schematically depicts a plasma processing device according to one or more embodiments shown and described herein. The plasma processing device generally comprises a vacuum chamber, a dielectric window sealing an opening in the vacuum chamber, an energy source, at least one air amplifier, and at least one heating element. Various embodiments of the plasma processing device and the operation of the plasma processing device will be described in more detail herein.

The plasma processing device 100 comprises a vacuum chamber 20 for enclosing plasma processing gases and plasma during the processing of a substrate 24. The vacuum chamber 20 can be formed from a metallic material that can be set to a reference potential. A substrate 24 can be located within the vacuum chamber 20 for processing. The vacuum chamber 20 can enclose plasma processing gases, which may comprise halogens or halogen elements such as, for example, fluorine (F), chlorine (Cl), bromine (Br), iodine (I), and astatine (At). Moreover, specific process gases may include $CClF_3$, $C_4F_8$, $C_4F_6$, $CHF_3$, $CH_2F_3$, $CF_4$, $HBr$, $CH_3F$, $C_2F_4$, $N_2$, $O_2$, $Ar$, $Xe$, $He$, $H_2$, $NH_3$, $SF_6$, $BCl_3$, $Cl_2$, and other gases capable of being ionized.

The plasma processing device 100 comprises a dielectric window 10 through which electromagnetic energy can be transmitted. The dielectric window 10 comprises a plasma exposed surface configured to be exposed to the interior of the vacuum chamber 20 and an air exposed surface 14. The dielectric window 10 is formed from a dielectric material that transmits electromagnetic energy such as, electromagnetic energy having a frequency range of 100 kHz to 100 MHz. Suitable dielectric materials include quartz and ceramics comprising, for example, Aluminum nitride (AlN), Aluminum oxide ($Al_2O_3$), or any other refractory material having similar transmissive properties.

An energy source 30 generates electromagnetic energy sufficient to ionize the plasma processing gases. The energy source 30 can include an inner coil 32 and an outer coil 34. It is noted that the energy source 30 can include coils formed in any shape suitable to generate electromagnetic energy such as, for example, faceted concentric segments concentric segments that are formed at angular turns with respect to one another, solenoid shaped conductors, toroid shaped conductors or combinations thereof.

The energy source 30 can be capable of generating electromagnetic energy over a wide range of powers such as, for example in some embodiments about 50 W to about 20 kW, in one embodiment greater than about 2 kW, in another embodiment about 3 kW, or in yet another embodiment about 4.5 kW. In some embodiments, the inner coil 32 and the outer coil 34 are conductively coupled with one another. In other embodiments multiple coils can be powered by multiple RF generators. It is noted that, while the energy source 30 is depicted as a multi-coiled RF source, the energy source can be any device capable of generating electromagnetic energy to generate an inductively coupled plasma such as, but not limited to, a radio frequency (RF) source, electron cyclotron resonance (ECR), a microwave horn, slotted antennae, or helicon sources, which use a spiral antenna wrapped around a cylindrical window. The plasma processing device 100 may optionally comprise a plenum 40 for directing a flow of air over the dielectric window 10.

In one embodiment of the plasma processing device 100, the vacuum chamber 20 can be coupled to the dielectric window 10. For example, an opening of the vacuum chamber 20 can be sealed at least in part by the dielectric window 10. Specifically, the plasma exposed surface of the dielectric window 10 can be exposed to plasma and/or plasma processing gases during the operation of the plasma processing device 100. It is noted that, while the dielectric window 10 is depicted in FIG. 1 as being coupled to the top of the vacuum chamber 20, the dielectric window 10 may seal any portion of the vacuum chamber 20 suitable to receive electromagnetic energy.

In some embodiments, the plasma processing device 100 may include a heater 26 for heating portions of the dielectric window 10 and reducing stresses within the dielectric window 10. Other embodiments not include heater 26 in the plasma processing device 100. Further yet, other embodiments may include a heater element coupled to the air amplifier to heat the dielectric window 10, as described in more detail below with reference to FIGS. 4-6.

The energy source 30 can be disposed outside of the vacuum chamber 20 and adjacent to the dielectric window 10. A plenum 40 can be located adjacent to the energy source 30 and the dielectric window 10 such that the plenum 40 is in fluid communication with the air exposed surface 14 of the dielectric window 10. In one embodiment, the plenum 40 is located between the inner coil 32 and the outer coil 34.

During operation, the energy source 30 transmits electromagnetic energy through the dielectric window 10 and into the vacuum chamber 20 to transform at least a portion of the plasma processing gas into plasma. A portion of the electromagnetic energy is transformed into heat energy that can be absorbed by the dielectric window 10. Specifically, some electromagnetic energy can be converted into heat according to the dielectric properties of the dielectric window 10 and a further portion of the electromagnetic energy can be absorbed by the dielectric window 10 after the chamber ionizes the plasma processing gases (e.g., the dielectric window 10 can be heated by the plasma via plasma exposed surface). Accordingly, the temperature of the dielectric window 10 can be increased by the electromagnetic energy. In some embodiments, the electromagnetic energy is anisotropic such that different portions of the dielectric window 10 are subjected to varying amounts of electromagnetic energy. It is believed that the heat induced in the dielectric window 10 can be correlated with the amount of electromagnetic energy transmitted through the dielectric window 10. For example, in the embodiments described herein greater than about 40% of the electromagnetic energy can be absorbed as heat by the dielectric window 10. The dielectric window can absorb at least about 0.4 kW of electromagnetic energy as heat such as, for example, in one embodiment greater than about 1 kW, in another embodiment about 1.5 kW, or in yet another embodiment about 2.25 kW. Accordingly, an elevated temperature region (hot spot) can be formed in the portion of the dielectric window 10 that is subjected to a relatively high amount of heat induced by the electromagnetic energy with respect to the other portions of the dielectric window 10.

The plasma processing device 100 comprises at least one air amplifier 60 for providing air to the plenum 40. One or more ducts 50 couple the air amplifier 60 to the plenum 40. It is noted that, while FIG. 1 depicts four air amplifiers 60 and four ducts 50, the plasma processing device 100 can have any number of air amplifiers 60 and ducts 50 sufficient to provide adequate cooling to the dielectric window 10. Several embodiments are described below including different number of plenums in different locations above the dielectric window 10. Further, some embodiments may provide a flow of air over the dielectric window without the use of a plenum.

Air supplied to the plenum 40 can be purged passively. For example, the plenum 40 can be housed within a pressure controlled chamber 22. The pressure controlled chamber 22 can be maintained at a pressure that is lower than ambient pressure and the outlet 44 of the plenum 40 can purge air directly into the pressure controlled chamber 22. The purged air can be removed from the pressure controlled chamber 22 via an exhaust system (not depicted in FIG. 1). In another embodiment, the pressure controlled chamber 22 can be maintained at a pressure that is higher than ambient pressure and the outlet 44 of the plenum 40 can purge air directly into the pressure controlled chamber 22. The purged air can be removed from the pressure controlled chamber 22 via vents (not depicted in FIG. 1). In further embodiments, the plenum can be in fluid communication with exhaust ducting (not depicted in FIG. 1) to passively purge air outside of the plasma processing device 100.

Additionally or alternatively, air can be actively purged from the plenum 40. For example, one or more air amplifiers 60 can be in fluid communication with the plenum 40 and configured to remove air from the plenum 40. Accordingly, while FIG. 1 depicts the ducts 50 in an input only arrangement, the ducts 50 can be configured to provide air and/or remove air from the plenum 40. Moreover, while FIG. 1 depicts the air amplifiers 60 as providing air to the plenum 40, the inlet 62 of an air amplifier 60 can be in communication with the outlet 44 of the plenum 40 to remove air from the plenum 40.

The injection of air flow with at least one air amplifier 60 can generate substantial amounts of back pressure, which can inhibit the flow of air towards the dielectric window 10. According to some embodiments, the plenum 40 generally is pressurized to a back pressure of at least about 1 in-H$_2$O such as, for example, in one embodiment greater than about 2 in-H$_2$O. Furthermore, it is noted that back pressure is not required for the operation of air amplifiers 60.

FIG. 2 schematically depicts a plenum according to one or more embodiments shown and described herein. The plenum 40 is formed into a partial enclosure and comprises one or more inlets 42 and one or more outlets 44. Accordingly, air can be received by an inlet 42 of the plenum 40 and introduced into a pressure region having a back pressure that is at least partially surrounded by the plenum 40. The plenum 40 can be divided into a plurality of segments 46, also referred to herein as sections, by partition walls 48, such that each segment comprises at least one inlet 42 and at least one outlet 44.

It is noted that, while the plenum 40 is depicted as being substantially ring shaped, the plenum 40 can be formed into any shape suitable to provide air to a region of the dielectric window 10. In one embodiment, the Plenum 40 is formed from a passive material such as, for example, polytetrafluoroethylene (PTFE or "teflon"), polyether ether ketone (PEEK), polyetherimide (PEI or "ultem"), ceramics, or any other electromagnetic energy transmissive material, and other materials are also possible.

FIG. 3 schematically depicts a plenum segment according to one or more embodiments shown and described herein. The plenum 40 can be formed as a single piece or as multiple segments that can be united with one another. Specifically, as depicted in FIG. 3, a plenum segment 140 may include a plurality of outlets 144 formed in the plenum segment 140. The plenum segment 140 may be substantially wedge-shaped and configured to combine with additional plenum segments 140 to enclose a substantially cylindrically shaped region or a substantially ring shaped region. It is noted, that the plenums described herein can be provided in any shape suitable to cooperate with the energy source 30 and provide pressurized cooling flow to the dielectric window 10 or a desired region thereof.

Figure 4A:
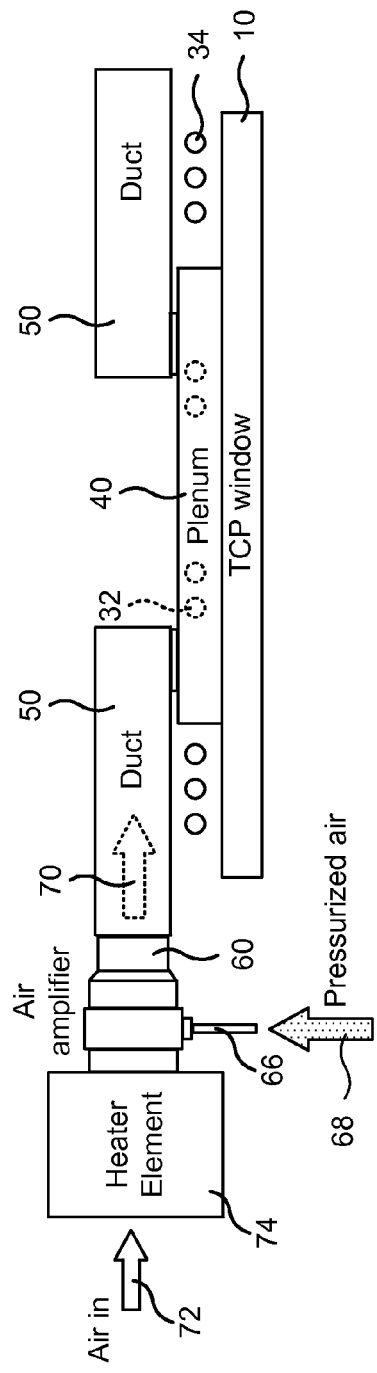
FIG. 4A illustrates a heater element coupled with the air amplifier to heat the flow of air, according to one embodiment.

FIG. 4A illustrates a heater element coupled to the air amplifier to heat the flow of air provided to the dielectric window, according to one embodiment. As discussed above with reference to FIG. 1, the plasma processing device 100 comprises at least one air amplifier 60 for providing air to the plenum 40 or directly to the chamber window 10. Each air amplifier 60 comprises an inlet for receiving input air 72, an exhaust 64 for outputting air 70 and a control input 66 for receiving pressurized air 68 (e.g., clean dry air, compressed air). Without being bound to any specific theory, it is believed that pressurized air 68 injected into the control input 66 provides a relatively large amount of air 70, as compared to the pressurized air 68, in accordance with Bernoulli's principle and the Coanda effect. The flow of air 70 is used as cooling air when heater 74 is not activated (e.g., Off), and as hot air to heat up the cooling window when heater 74 is activated (e.g., On). In one embodiment, the plenum 40 is ring shaped and situated between inner coil 32 and outer coil 34. It is noted that only one air amplifier 60 is shown in FIG. 4A, but other air amplifiers may be coupled to each of the ducts 50 coupled to the plenum 40.

In one embodiment, the heater element 74 is activated (e.g., turned On) before starting the processing of the substrate in order to bring the window up to a predetermined temperature. Once the window reaches the predetermined temperature, the heater element 74 is deactivated (e.g., turned Off) and the RF is powered in the chamber to start plasma processing. In one embodiment, the temperature of the window is monitored via temperature sensors during substrate processing operations, and when the temperature reaches a second predetermined temperature, the air amplifier 60 is activated (without activating a heater element 74) to provide cooling air 70 to TCP window 10.

After the window cools down to a third predetermined temperature, the air amplifier 60 is deactivated. This way, the temperature of window 10 is kept within a range of temperatures, avoiding thermal stress on the window 10 that can cause breakage or multifunction. The ability to control the temperature, with the flow of air provided to the window, gives the design engineer a better control of the chamber processes. For example, the goal during a processing step is to keep the window below 120° C. However, having the ability to cool the window more effectively using the present embodiments, the chamber processes can operate at lower temperatures, such as 60° C., 80° C., in the range between 50° C. to 100° C., etc.

The pressurized air 68 (e.g., compressed air) may enter the air amplifier 60 at a relatively high velocity compared to the air outside of the air amplifier 60. The pressurized air 68 can be directed towards the exhaust 64 of the air amplifier 60. In accordance with the Coanda effect, the pressurized air 68 may travel substantially along the annular boundary of air amplifier 60.

The air amplifier 60 can provide suitable amounts of air 70 at a rate of at least about 20 cfm such as, for example, in one embodiment about 20 cfm to about 3,000 cfm, in another embodiment about 25 cfm to about 900 cfm, in yet another embodiment about 30 cfm to about 230 cfm or in a further embodiment about 125 cfm to about 230 cfm.

In one embodiment, at least one air amplifier 60 is in fluid communication with the plenum 40 via one or more ducts 50. The one or more ducts 50 can be formed from passive material such as, for example, teflon, PEEK, ultem, ceramics, or any other electromagnetic energy transmissive material. In some embodiments, non-transmissive materials are utilized. For example, if micro-wave sources are used to generate the plasma, the duct work may be made of metal.

Each duct 50 may include an amplifier orifice in fluid communication with the exhaust of an air amplifier 60 and a plenum orifice in fluid communication with an inlet of the plenum 40. Accordingly, the air amplifier 60 can supply cooling air or heating air to the dielectric window 10 via duct 50 and plenum 40.

Figure 4B:
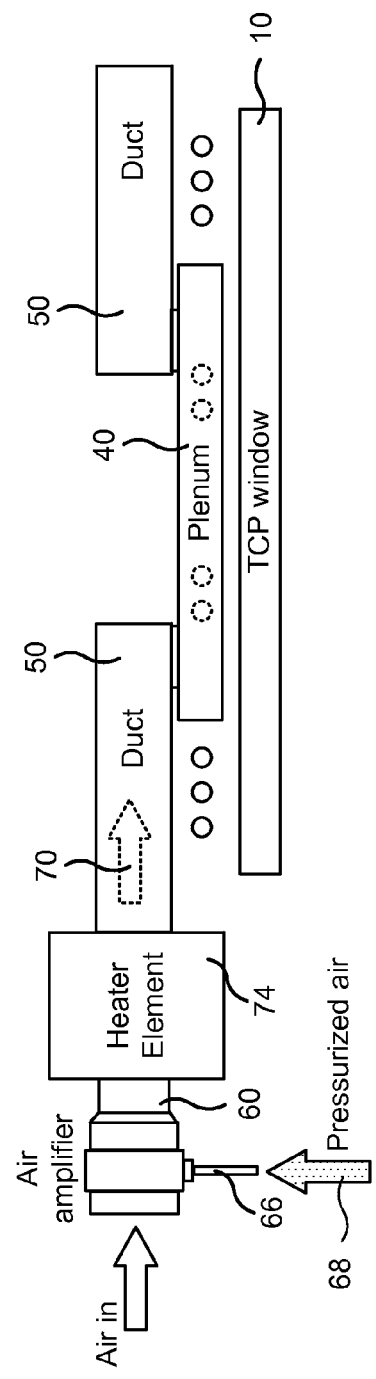
FIG. 4B illustrates a heater element coupled serially between the air amplifier and the duct attached to the plenum, according to one embodiment.

FIG. 4B illustrates a heater element coupled serially between the air amplifier and the duct attached to the plenum, according to one embodiment. The heater element may be coupled serially before or after air amplifier 60. FIG. 4A illustrates an embodiment where the heater element is situated ahead of the air amplifier 60, i.e., the input air 72 passes through the heater element before entering the air amplifier 60.

In the embodiment of FIG. 4B, heater element 74 is coupled serially between air amplifier 60 and duct 50. In this case, the input air 72 enters the air amplifier, and the output air coming out of the air amplifier is then heated before passing through towards duct 50.

Additionally, plenum 40 might be directly in contact with window 10, as illustrated in FIG. 4A. In other embodiments, the plenum might be spaced apart from window 10 to allow flow of air underneath the plenum to spread over the window 10. The offset distance between the plenum 40 and window 10 can be any distance suitable to promote effective cooling of the dielectric window 10 such as, for example, in one embodiment greater than about 0.25 mm, or in another embodiment about 2 mm. FIG. 4B illustrates the embodiment where the plenum is spaced apart from the window, but other embodiments may have plenum 40 in contact with window 10.

Figure 5:
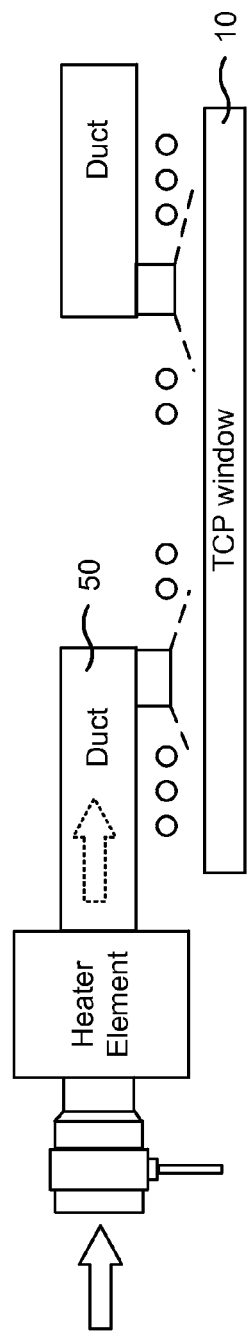
FIG. 5 illustrates the supply of air flow directly over the dielectric window without a plenum, according to one embodiment.

FIG. 5 illustrates the supply of air flow directly over the dielectric window without a plenum, according to one embodiment. In one embodiment, the air is guided through the duct and supplied over the dielectric window 10 without plenum 40. For example, the flow of air leaves duct 50 at the bottom of duct 50 and towards window 10, causing the air exiting the duct to contact window 10.

In some embodiments, there can be a mixture of air supplied directly from the ducts to the window, and air supplied via a plenum to the window. One example is given below with reference to FIG. 7D.

It is noted that the embodiments illustrated in FIGS. 4A, 4B, and 5 are exemplary. Other embodiments may utilize different ducts and plenums, or arrange the plenums in other locations over the window, etc. The embodiments illustrated in FIGS. 4A, 4B, and 5 therefore should not be interpreted to be exclusive or limiting, but rather exemplary or illustrative.

Figure 6:
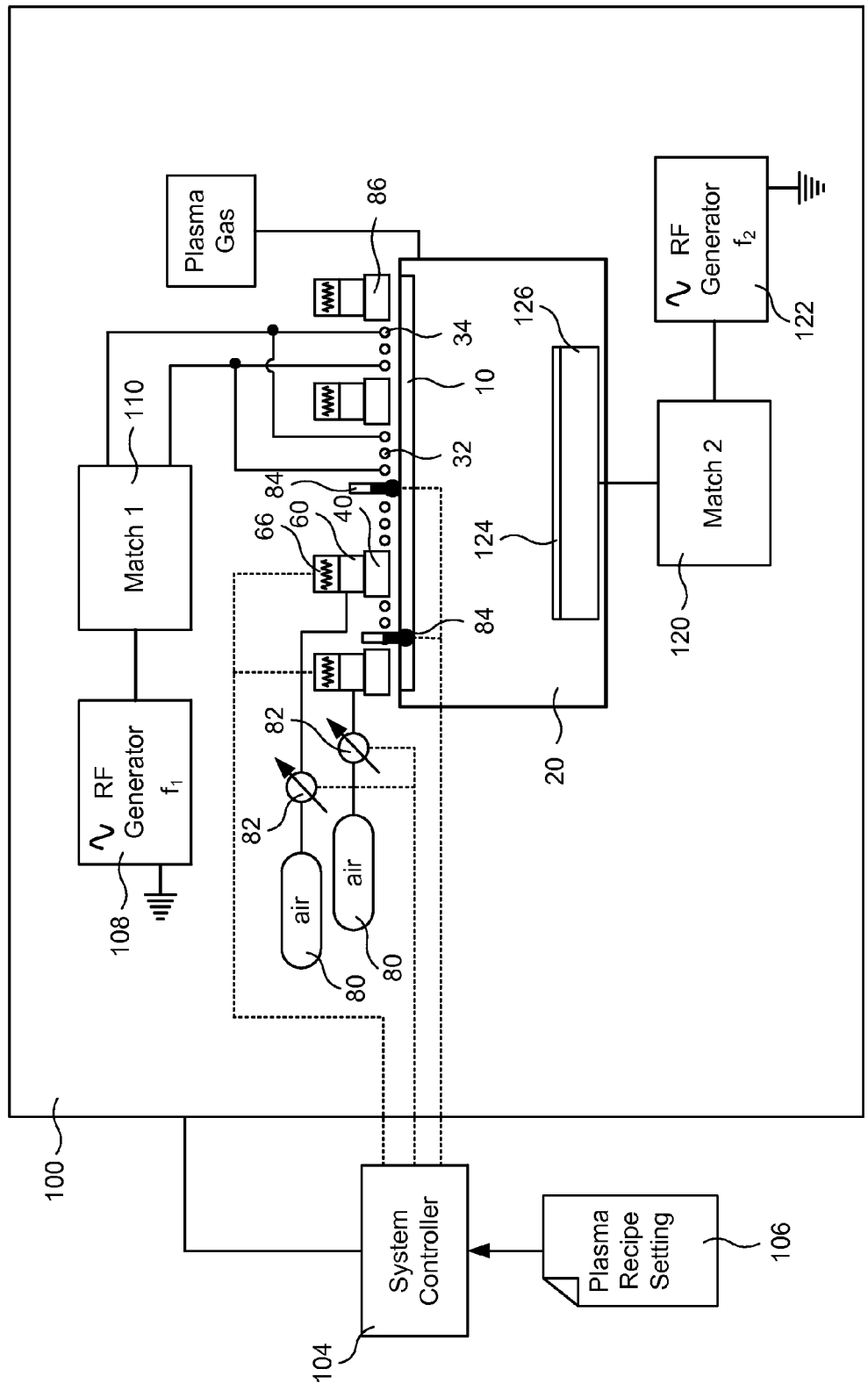
FIG. 6 illustrates a chamber with a plurality of plenums, according to one embodiment.

FIG. 6 illustrates a chamber with a plurality of plenums, according to one embodiment. In one embodiment, the substrate is 300 mm in diameter, but the same principles apply to wafers of any size, such as 450 mm. FIG. 6 illustrates a chamber with two coils, inner coil 32 and outer coil 34, and two plenums, inner plenum 40 and outer plenum 86. It is noted that in FIG. 6 the ducts 50 are located behind air amplifier 60 and are omitted to not obscure details of the chamber.

Chamber 100 includes RF generator 108 coupled to a matching network 110 that provides RF power to the TCP chamber. Further, the chamber includes a second RF generator 122 coupled to a matching network 124 providing RF power to a bottom electrode in the chamber.

A system controller 104 includes a computer program to manage the operation of the chamber. The computer program receives a plasma recipe setting 106 (e.g., in a computer readable medium) which determines the settings for performing each of the steps in the chamber to process the substrate. System controller 104 is coupled to the different elements of the chamber and is able to control how the different elements operate, e.g., turn on or off RF power, activate or deactivate air amplifiers or heaters, introduce plasma gas in the chamber, etc. Some of the connections from system controller 104 are shown in FIG. 6, while other connections from system controller 104 have been omitted not to obscure the details in FIG. 6.

In one embodiment, regulator 82 is placed between the source of compressed air and the air amplifier or heater. The system controller is operable to control the regulator 82 in order to control the amount of pressure air that is fed to the air amplifier. In one embodiment, regulator 82 has two states: On and Off. In the On state, the regulator 82 lets pressurized air 80 to enter the air amplifier or heater, without providing any resistance to the flow of air. In the Off state, no flow of air is provided to the air amplifier or heater. In other embodiments, the regulator 82 may have a plurality of states, each state providing a different amount of pressurized air 82 to the air amplifier 60. This way, system controller 104 is able to better control the temperature on the dielectric window by having a different amount of air provided based on the temperature of the dielectric window. For example, when the dielectric window has reached a very high temperature, the system controller can activate regulator 82 to provide as much air as possible, while with lower temperatures the system controller may activate regulator 82 to provide a lesser amount of air.

One or more temperature sensors 84 provide thermal readings to the system controller in order to implement the desire temperature-management program. In one embodiment, each regulator may be activated independently from other regulators in the chamber, thus providing the system controller a better tuning of the temperature in the different areas of the window. For example, if a center area of the window becomes hotter than desired while the outside area of the window is operating at a desired temperature, system controller 104 may activate the regulators controlling the air amplifiers over the inner plenum 40 and not activate the air amplifiers coupled to outer plenum 86. Similarly, if only a section of the central area of the window becomes hotter than desired, system controller 104 may activate the air amplifier coupled to a single section, instead of activating the regulators for all the air amplifiers coupled to the plenum.

Figure 7A:
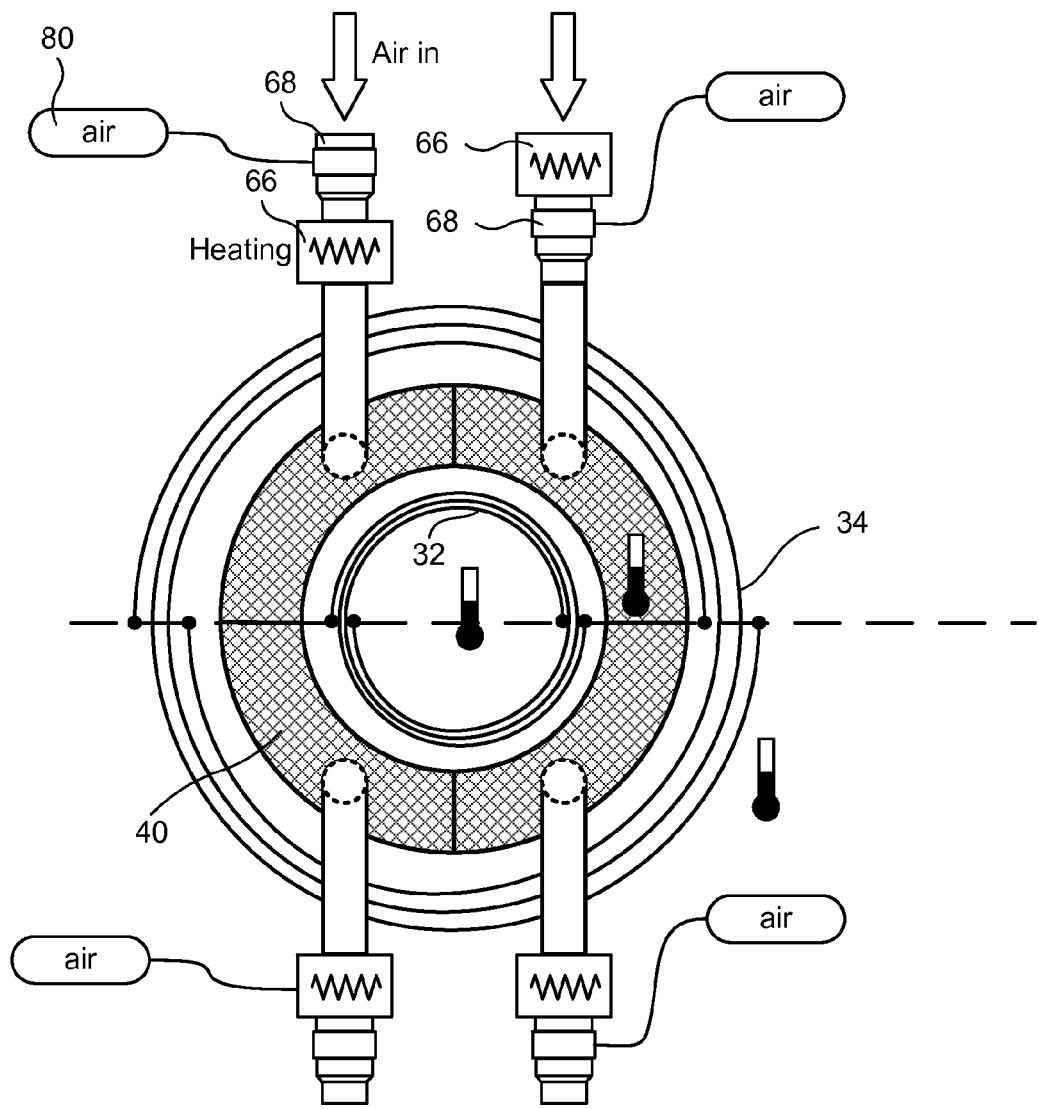
FIGS. 7A-7D illustrate several embodiments for different configurations to cool the chamber window utilizing compressed air.

FIGS. 7A-7D illustrate several embodiments for different configurations to cool the chamber window utilizing compressed air. FIG. 7A is a top view of the plasma processing system utilized for etching operations, in accordance with one embodiment of the present invention. As discussed above, the TCP coils are shown to include an inner coil (IC) 32, and an outer coil (OC) 120. The illustration in FIG. 7A was provided to show the circular winding associated with each of the inner and outer coils of the TCP coil utilized in chamber 102, and the relative position of the elements used for cooling or heating the dielectric window, in accordance with one embodiment of the present invention. It should be appreciated that other types of coil configurations are also possible.

The connections between the coil ends are illustrated relative to the elements provided for cooling or heating the dielectric window: air amplifier 68, heating 66 and plenum 40. It is possible to have a dimensional coil that provides a dome type structure, and other coil type structures other than flat coil distributions. Depending on the configuration associated with the geometry of the TCP coil, the location and shape of the plenum and the ducts coupled to the plenum may be adjusted.

In the embodiment shown in FIG. 7A, there are 4 air amplifiers: two situated on one side of the chamber, and the other two situated in the opposite side of the chamber. This way, 4 ducts provide air to respective sections of the plenum 40. In other embodiments, the location of the air amplifiers may vary, such as having one air amplifier on each side of the chamber, having all air amplifiers situated on the same side of the chamber's, etc. Accordingly, the connection point between each duct and the plenum may be adjusted in order to accommodate the geometry so all ducts can be coupled to air amplifiers that are located outside the chamber, in one embodiment.

Figure 7B:
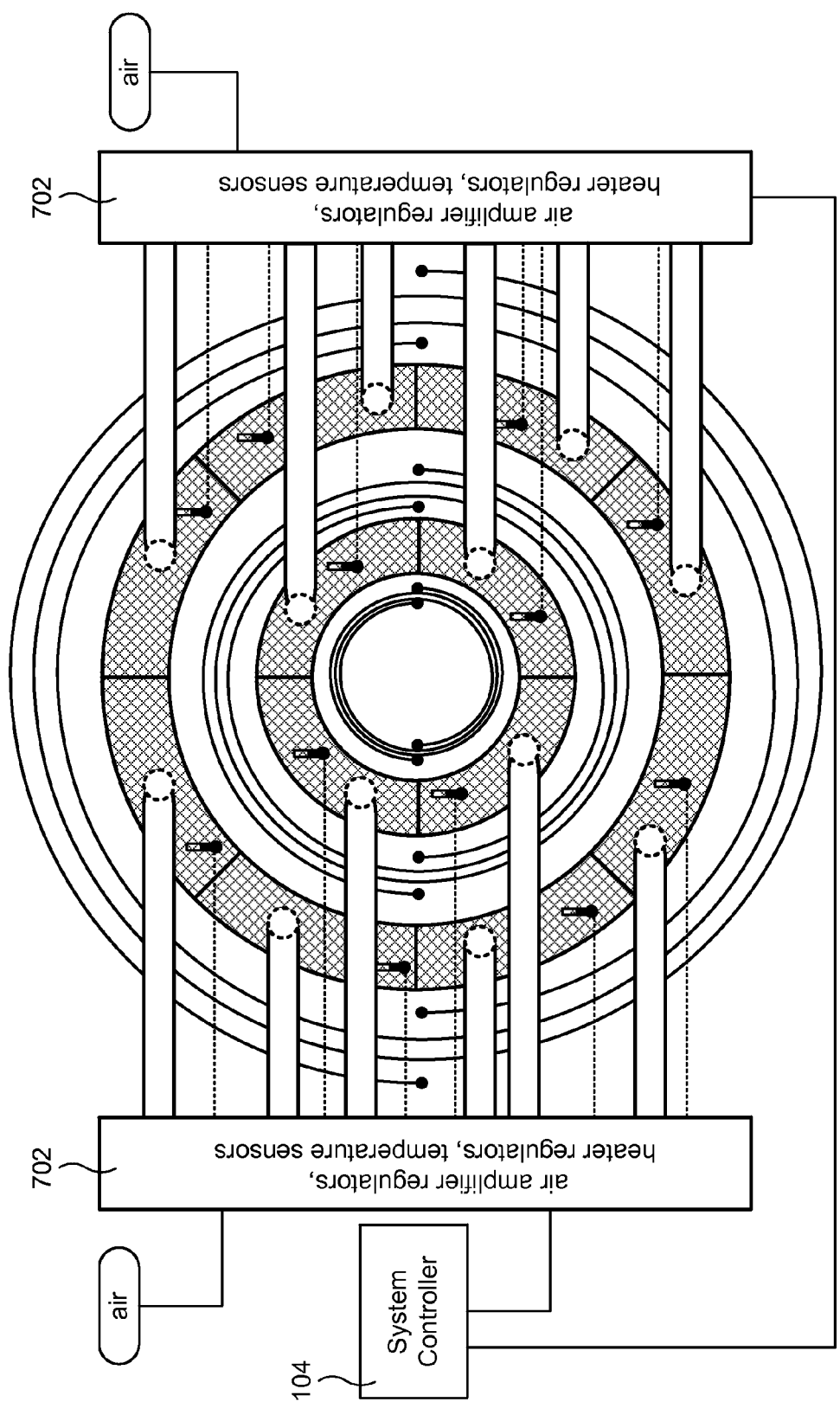

FIG. 7B illustrates a 450 mm chamber with three coils, according to one embodiment. In order to not obscure FIG. 7B, some connections and elements have been omitted for simplicity of description. In one embodiment, each of the ducts shown is coupled to an air amplifier that can supply cool or warm air. Cooling and heating structure 702 includes air amplifiers, air amplifier regulators, heaters, temperature control, etc. System controller 104 is coupled to the different elements in the chamber in order to activate or deactivate the flow of air, hot or cold, over the dielectric window.

The chamber in FIG. 7B includes three coils: inner coil, middle coil, and outer coil. Additionally, the chamber includes an inner plenum and an outer plenum. The inner plenum is situated between the inner coil and the middle coil, while the outer plenum is situated between the middle coil and the outer coil. By having two different plenums in different areas, system controller 104 is able to provide better temperature control over the dielectric window. One or more temperature sensors are distributed substantially around the dielectric window to provide temperature measurements of the different areas. In one embodiment, only one temperature sensor is used, and in other embodiment each section or segment of the plenums have respective temperature sensor associated therewith, but other configurations of temperature sensors are also possible.

In one embodiment, the inner plenum includes 4 different sections while the outer plenum includes 8 different sections, which betters allow the control of air flow to the outer plenum, given its larger diameter. Other embodiments may utilize different number of sections for each plenum, such as one, two, three, six, etc.

In the embodiment shown in FIG. 7B, each section of a plenum has an associated temperature sensor, air amplifier, and heater. The temperature control program in system controller 104 monitors the measurements obtained from the different temperature sensors and activates or deactivates the air amplifier and heaters in order to maintain each area associated with a respective section at a desired temperature. However, other temperature-control methods are also possible, such as turning on or off of the air amplifiers at the same time, or turning on or off simultaneously all the air amplifiers associated with one of the plenums.

Figure 7C:
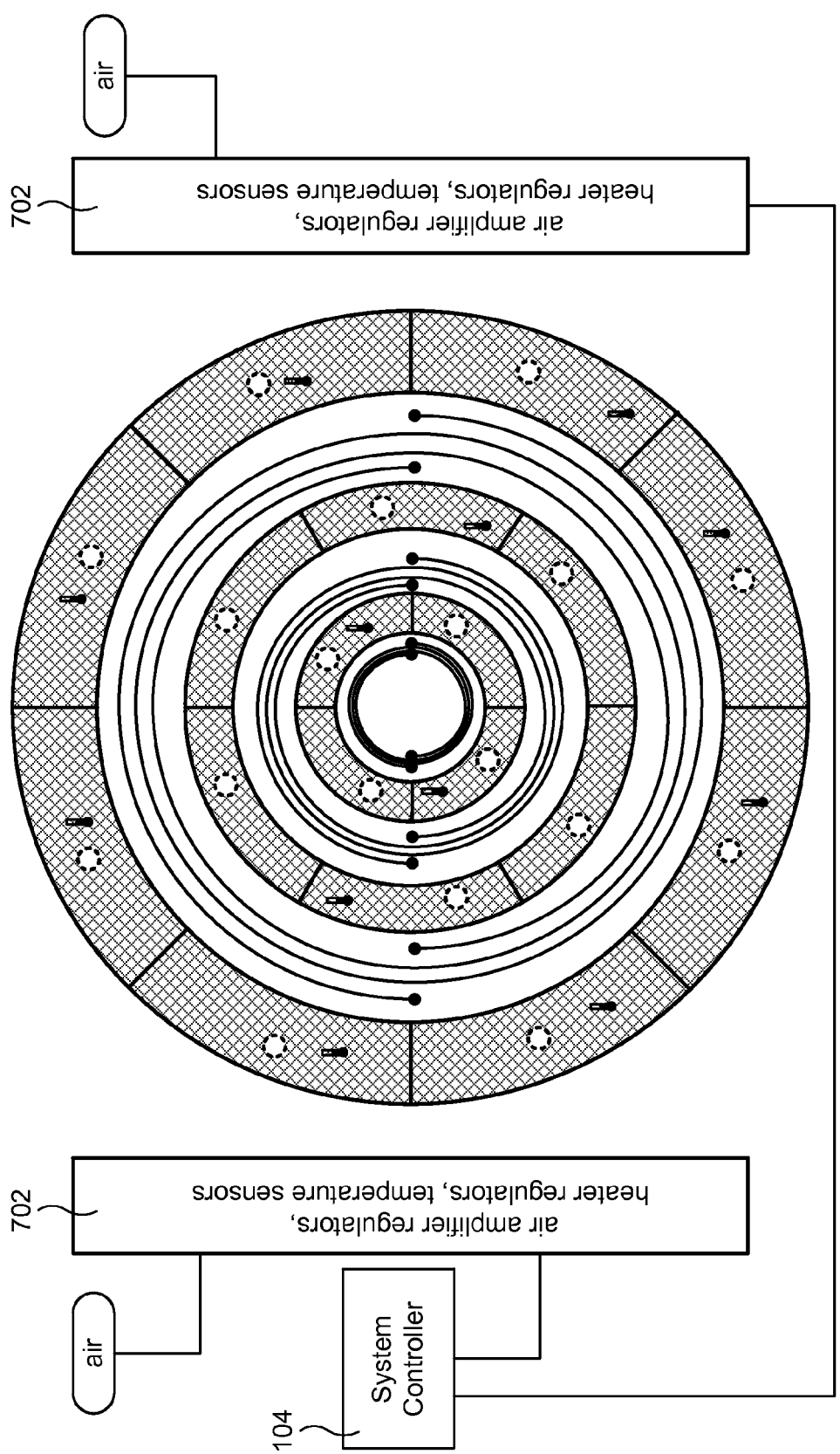

FIG. 7C presents a top view of a chamber with three coils and three plenums. Some of the connections to cooling and heating structure 702 have been omitted not to obscure the details of the architecture. The three plenums and the coils are ring shaped and are alternated going from the center towards the perimeter of the window over the processing chamber.

In one embodiment, the inner plenum has four sections, the middle plenum has six sections, and the outer plenum has eight sections, although other number of sections per plenum is also possible. The use of three different plenums allows fine-tuning of the temperature control on the window. As discussed above, the air amplifiers coupled to the different sections may all be activated at once or activated individually, based on temperature readings obtained from the temperature sensors situated substantially around the dielectric window.

In another embodiment, not shown in FIG. 7C, the ducts leading to the different plenums may share air from one or more of the air amplifiers. For example, in one embodiment, two ducts share the flow produced by one air amplifier, and in other embodiments more than two ducts may be coupled to the same air amplifier. In the case where two sections share one air amplifier, the same duct may be utilized to couple the air amplifier to the two different sections, the duct having two exit outlets instead of one, one outlet for each section.

Figure 7D:
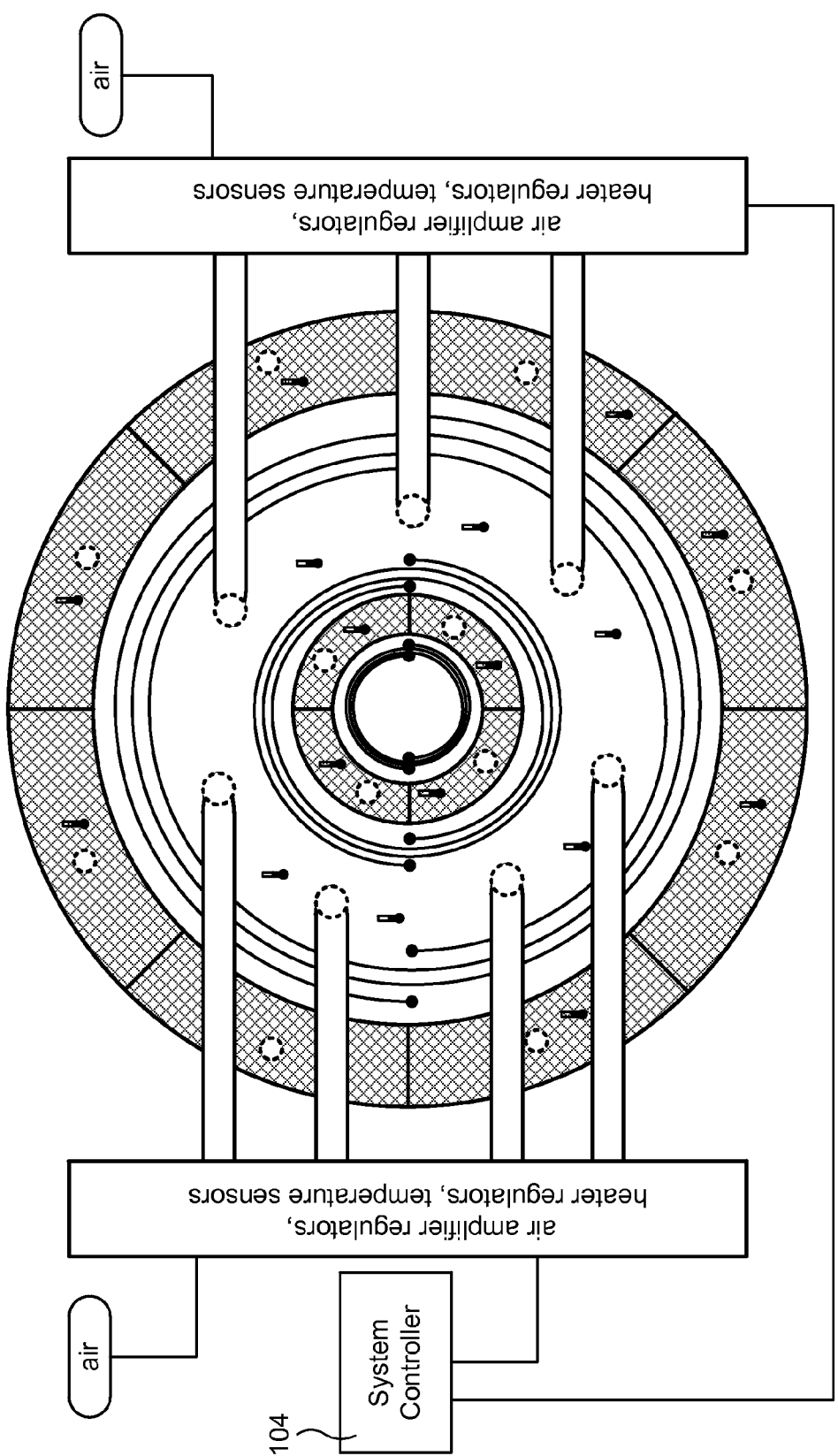

FIG. 7D illustrates a chamber with two coils, two air amplifiers and a plurality of ducts that provide a flow of air directly over the window without a plenum. In some embodiments, at least one air amplifier can be used without a plenum. The embodiment illustrated in FIG. 7D includes 3 coils and 2 plenums. The first plenum is located between the inner coil and the middle coil, and the second plenum is located outside the outer coil. Additionally, a plurality of ducts provides a flow of air to the center of the window, between the middle and outer coil, without the use of a plenum.

In one embodiment, the output of the ducts that feed air to the window are oriented perpendicularly with respect to the air exposed surface 14 of the dielectric window 10. Accordingly, the exhaust 64 of the at least one air amplifier 60 can be oriented with respect to the dielectric window 10, such that the cooling air 70 flows along a path that is substantially perpendicular to the air exposed surface 14 of the dielectric window 10. In another embodiment, not shown, the at least one air amplifier 60 is oriented at an oblique angle α with respect to the air exposed surface 14 of the dielectric window 10. Accordingly, the exhaust 64 of the at least one air amplifier 60 can be oriented with respect to the dielectric window 10, such that the cooling air 70 flows along a path that is aligned with the air exposed surface 14 of the dielectric window 10 at an oblique angle α. It is noted that the oblique angle α may be any angle suitable to control to temperature of the dielectric window 10.

It is noted that the embodiments illustrated in FIGS. 7A-7D are exemplary. Other embodiments may utilize different number of coils, plenums, ducts, sections, etc. The embodiments illustrated in FIGS. 7A-7D should therefore not be interpreted to be exclusive or limiting, but rather exemplary or illustrative.

Figure 8:
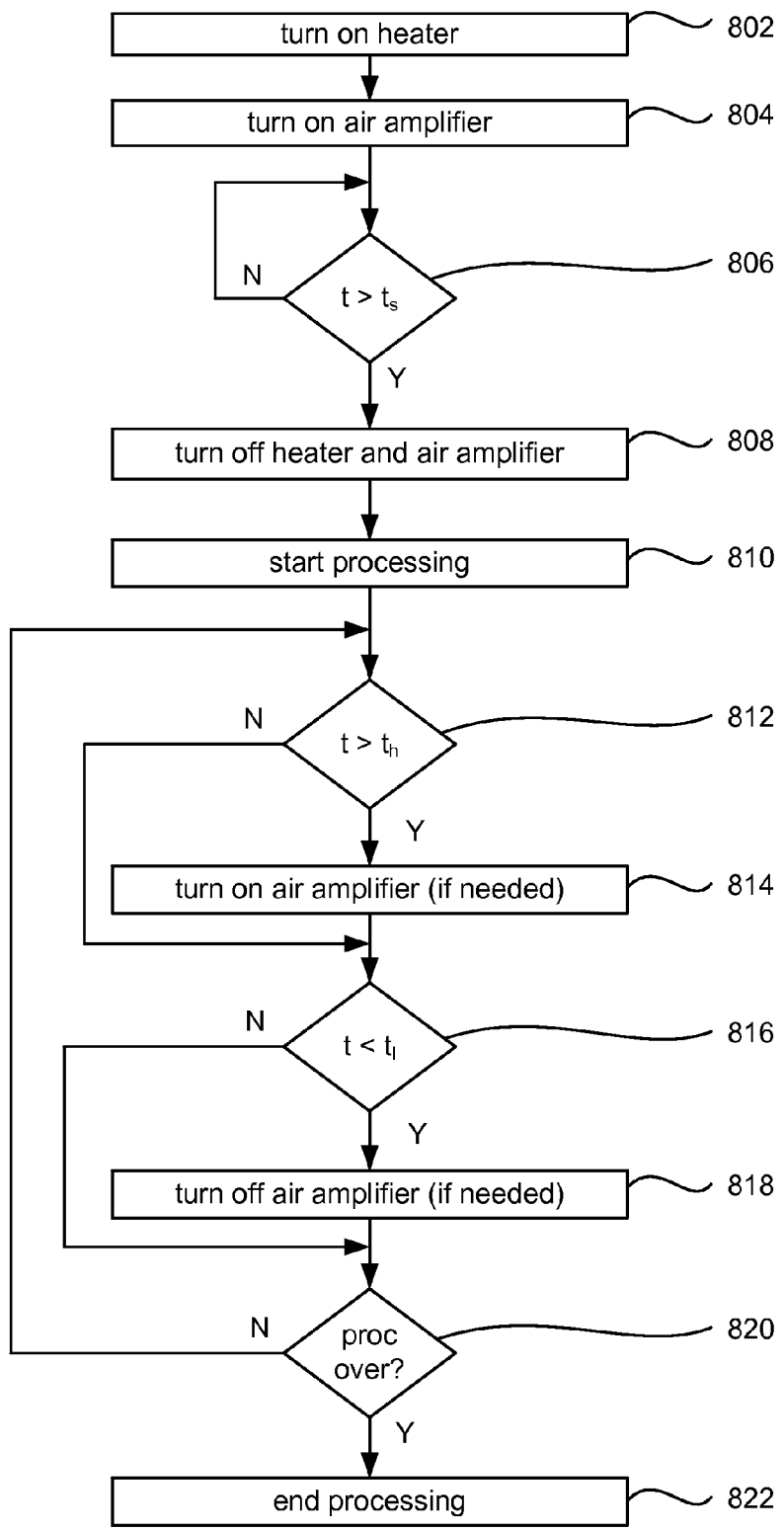
FIG. 8 is a flowchart of a method for managing the temperature of the window during processing, according to one embodiment.

FIG. 8 is a flowchart of a method for managing the temperature of the window during processing. In operation 802, the heater is turned on before turning on the air amplifier in operation 804. Consequently, the air exiting the air amplifier will be heated air. From operation 804, the method flows to operation 806 where a check is made to determine if the temperature t of the dielectric window has reached the required heating temperature $t_s$. The method repeats checking the temperature of the window in operation 806 until the temperature t reaches the required heating temperature $t_s$, then the method continues to operation 808, where the heater and the air amplifier are turned off.

From operation 808, the method flows to operation 810 where processing of the substrate is started in the chamber, e.g., the RF power is turned on and the plasma is ignited in the chamber. From operation 810, the method flows to operation 812 where a check is made to determine if the temperature t of the dielectric window is above a temperature high threshold $t_h$. If temperature t is above temperature $t_h$ the method flows to operation 814, otherwise the method flows to operation 860.

In operation 814, the air amplifier is turned on, unless the air amplifier was already on. From operation 814, the method flows to operation 816 were a check is made to determine if the temperature t is below a low threshold temperature $t_l$. If the temperature t is below temperature $t_l$, the method flows to operation 818, and if the temperature t is not below temperature $t_l$ the method flows to operation 820.

In operation 818, the air amplifier is turned off, unless the air amplifier is already off. From operation 818 the method flows to operation 820, where a check is made to determine if the processing of the substrate is complete. If processing is complete, the method flows to operation 822 to terminate the processing of the substrate, and if the processing is not complete, the method flows back to operation 812 to repeat the temperature checks discussed above.

Figure 9:
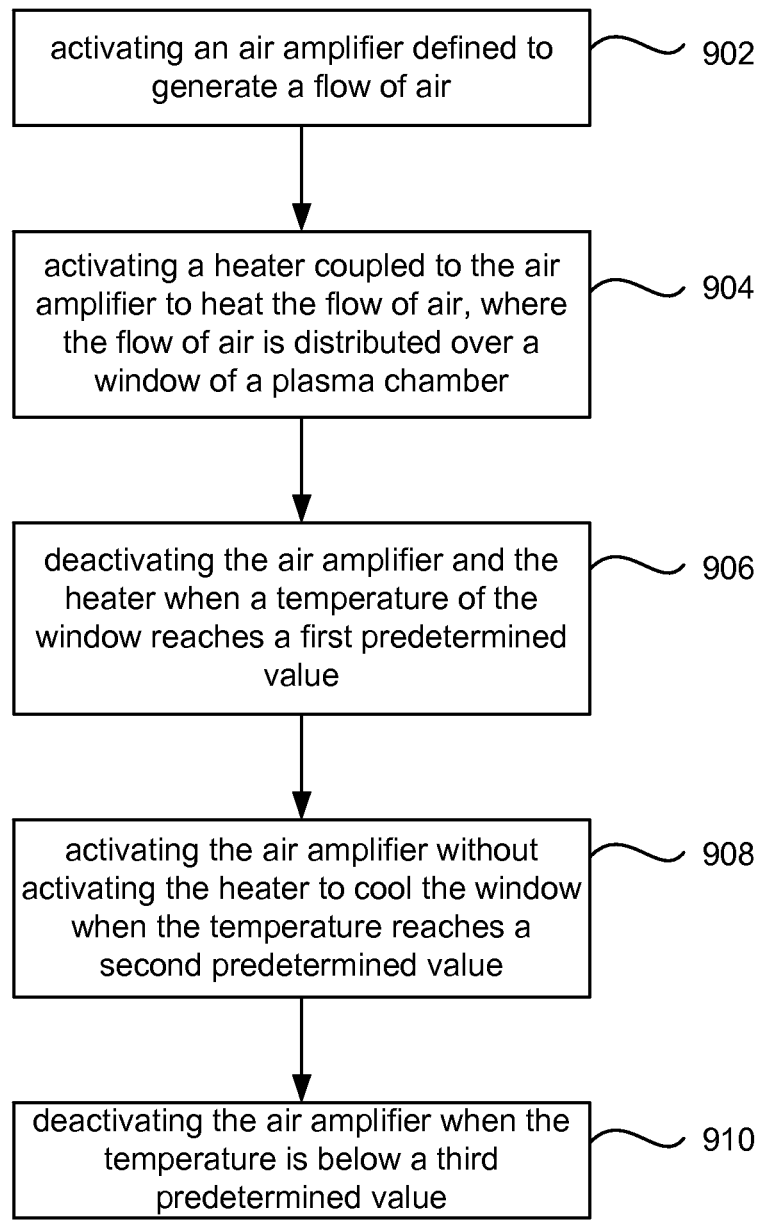
FIG. 9 is a flowchart of a method for managing the temperature of the chamber window, according to one embodiment.

FIG. 9 is a flowchart of a method for managing the temperature of the chamber window, according to one embodiment. In operation 902, and air amplifier is activated, the air amplifier being operable to generate a flow of air over a dielectric window of a plasma manufacturing chamber.

From operation 902, the method flows to operation 904 where a heater, coupled to the air amplifier, is activated. Once the heater is activated, e.g., turned on, the flow of air provided to the window on the plasma chamber will include heated air.

From operation 904, the method flows to operation 906 where the air amplifier and the heater are deactivated after the temperature in the window reaches a first predetermined temperature value. From operation 906, the method flows to operation 908 where the air amplifier is activated, without activating the heater, to cool the window after the temperature in the window reaches a second predetermined value.

From operation 908, the method flows to operation 910 where the air amplifier is deactivated after the temperature in the window is below a third predetermined value.

Figure 10A:
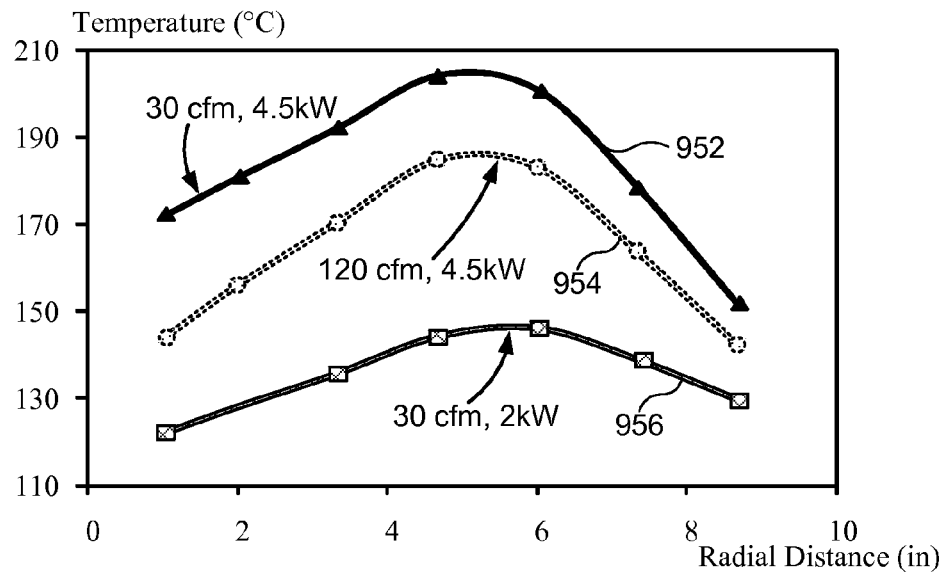
FIG. 10A is a chart showing the results of different tests for cooling the window with air, according to one embodiment.

FIG. 10A is a chart showing the results of different tests for cooling the window with air, according to one embodiment. The temperature on the window was measured at different points along the radius of the window. Then several experiments were made by operating the chamber at different power levels and with the different air amplifier pressures. The tests were performed on a test processing chamber similar to the chamber described in FIG. 1.

Line 952 shows the data when using 4.5 kW of RF power and using air amplifiers operating at 30 cfm, line 954 shows the data for 4.5 kW and 120 cfm, and line 956 shows the data when using 2 kW and air amplifiers at 30 cfm. The results show that the temperature on the window is highest around 5 inches from the center, which is the area between the two RF coils, where the plenum is situated.

The results, according to one embodiment, showed that while operating at a lower power (e.g., 2 kW), 30 cfm are enough to cool the window. However, when operating at 4.5 kW, 30 cfm is not able to lower the temperature below about 200° C. at the hottest point in the window. The 120 cfm air amplifiers provide enough cooling to lower the maximum temperature on the window to about 180° C.

It is noted that the embodiments illustrated in FIG. 10 are exemplary. The results were obtained on a test chamber with specific parameters for testing the window temperature. Other embodiments may produce different results, and the results should not be considered as related to any performance claim regarding the embodiments presented. The embodiments illustrated in FIG. 10 should therefore not be interpreted to be exclusive or limiting, but rather exemplary or illustrative.

Figure 10B:
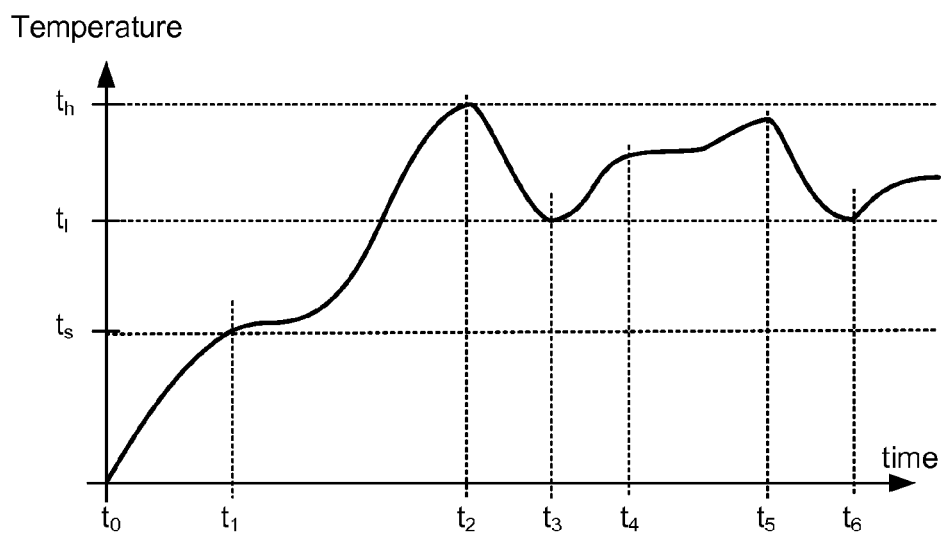
FIG. 10B illustrates an embodiment for temperature control of the dielectric window over time.

FIG. 10B illustrates an embodiment for temperature control of the dielectric window over time. Initially at $t_0$, the air amplifier (AA) and the heater are turned on while the RF power is off, to bring the temperature of the dielectric window to a desired temperature $t_s$. In one embodiment, the air amplifier is regulated to operate at 50% of capacity since the full power of the flow of air is not needed to heat the window. Of course, in other embodiments the air amplifier may operate at full capacity (100%).

At $t_1$, the temperature reaches $t_s$ and the air amplifier and heaters are turned off, while the RF power is turned on in preparation for processing in the plasma chamber. As RF power is provided to the chamber, the temperature grows gradually until it reaches $t_h$. At $t_2$, the air amplifier is turned on at full capacity (e.g., 100%) to start cooling the window.

The temperature on the window cools off as a result of the cooling from the air flow. At $t_3$, the temperature reaches $t_l$, a low threshold to turn off the cooling. As a result, the air amplifier is turned off at $t_3$. The temperature begins rising again. In one embodiment, the recipe calls for regulating the temperature with different degrees of performance for the air amplifier. At $t_4$, the air amplifier is turned on at less than full capacity (e.g., 60%) to start cooling the window before it reaches the maximum temperature $t_h$.

As a result of the cooling, the temperature on the window stays substantially constant for a period of time until it starts rising again (e.g., the cooling at this performance level of the air amplifier is not enough to keep the temperature constant for the given RF power). At $t_5$, the regulator is changed to operate at 80% in order to provide more cooling to the window, resulting in the gradual lowering of the temperature on the window. At $t_6$, the temperature reaches the low temperature $t_l$ and the air amplifier is turned off.

It is noted that the embodiment illustrated in FIG. 10B is exemplary. Other embodiments may utilize different power levels, or activate the air amplifier at different temperatures. The embodiment illustrated in FIG. 10B should therefore not be interpreted to be exclusive or limiting, but rather exemplary or illustrative.

Figure 11:
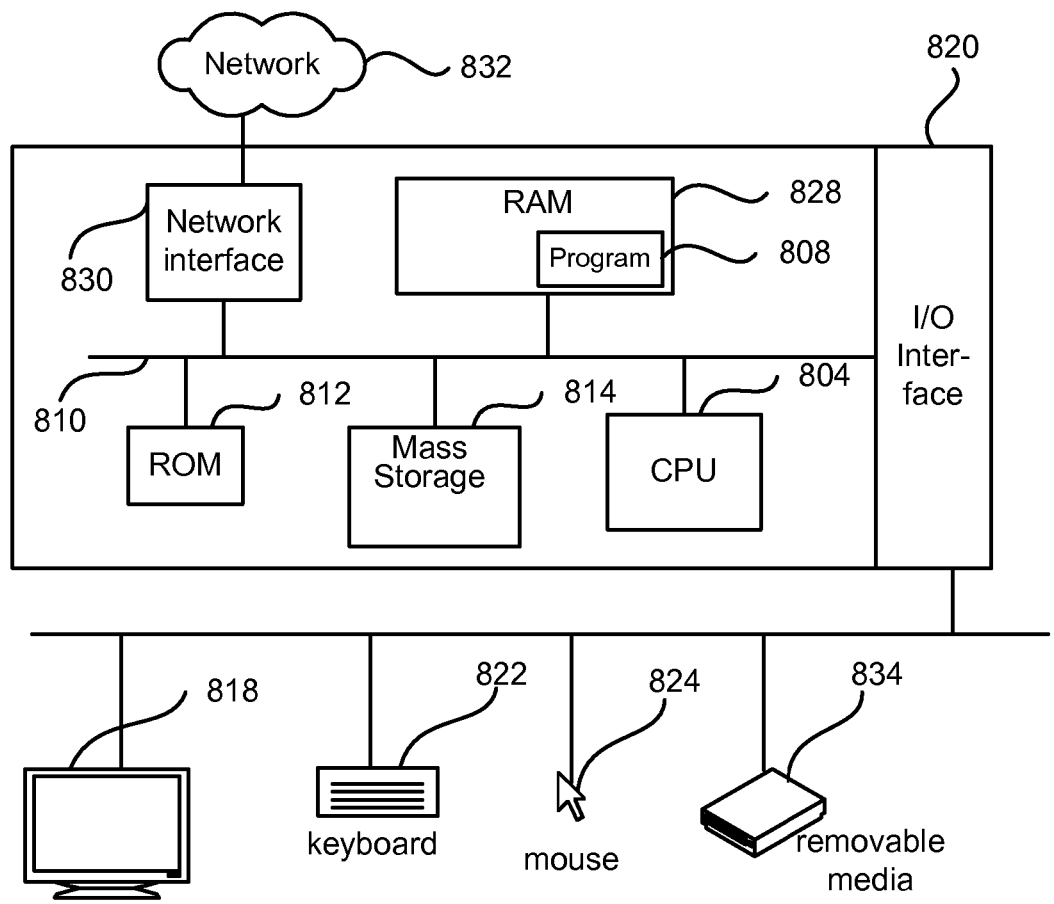
FIG. 11 is a simplified schematic diagram of a computer system for implementing embodiments described herein.

FIG. 11 is a simplified schematic diagram of a computer system for implementing embodiments described herein. It should be appreciated that the methods described herein may be performed with a digital processing system, such as a conventional, general-purpose computer system. Special purpose computers, which are designed or programmed to perform only one function may be used in the alternative. The computer system includes a central processing unit (CPU) 804, which is coupled through bus 810 to random access memory (RAM) 806, read-only memory (ROM) 812, and mass storage device 814. System controller program 808 resides in random access memory (RAM) 806, but can also reside in mass storage 814.

Mass storage device 814 represents a persistent data storage device such as a floppy disc drive or a fixed disc drive, which may be local or remote. Network interface 830 provides connections via network 832, allowing communications with other devices. It should be appreciated that CPU 804 may be embodied in a general-purpose processor, a special purpose processor, or a specially programmed logic device. Input/Output (I/O) interface provides communication with different peripherals and is connected with CPU 804, RAM 806, ROM 812, and mass storage device 814, through bus 810. Sample peripherals include display 818, keyboard 822, cursor control 824, removable media device 834, etc.

Display 818 is configured to display the user interfaces described herein. Keyboard 822, cursor control 824, removable media device 834, and other peripherals are coupled to I/O interface 820 in order to communicate information in command selections to CPU 804. It should be appreciated that data to and from external devices may be communicated through I/O interface 820. Embodiments can also be practiced in distributed computing environments where tasks are performed by remote processing devices that are linked through a wire-based or wireless network.

It is noted that although the above-described embodiments are described with reference to capacitively-coupled plasma (CCP) chambers, the principles presented can also be applied to other types of plasma chambers, e.g., a plasma chamber including an inductively coupled plasma (ICP) reactor, a plasma chamber including an electron-cyclotron resonance (ECR) reactor, etc.

It should now be understood that air amplifiers can be utilized with a variety of air channeling plenum designs to control the temperature of dielectric windows. Moreover, the model data indicates that air amplifiers are capable of providing relatively high rates of cooling air to dielectric windows with the aid of plenums even when subjected to back pressures sufficient to stall fan cooling systems. Accordingly, the embodiments described herein may be utilized to effectively cool dielectric windows that are subjected to electromagnetic energy in excess of about 3 kW such as, for through silicon via etching processes. Moreover, the embodiments described herein may be utilized to effectively cool dielectric windows that are subjected to other types of electromagnetic energy such as, for etch processes, chemical vapor deposition, oxide etching, metal etching, and the like.

Embodiments may be practiced with various computer system configurations including hand-held devices, microprocessor systems, microprocessor-based or programmable consumer electronics, minicomputers, mainframe computers and the like. The embodiments can also be practiced in distributed computing environments where tasks are performed by remote processing devices that are linked through a network.

One or more embodiments can also be fabricated as computer readable code on a computer readable medium. The computer readable medium is any data storage device that can store data, which can be thereafter be read by a computer system. Examples of the computer readable medium include hard drives, network attached storage (NAS), read-only memory, random-access memory, CD-ROMs, CD-Rs, CD-RWs, magnetic tapes and other optical and non-optical data storage devices. The computer readable medium can include computer readable tangible medium distributed over a network-coupled computer system so that the computer readable code is stored and executed in a distributed fashion.

Although the method operations were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

What is claimed is:

1. A semiconductor manufacturing apparatus comprising:
an air amplifier coupled to pressurized gas, the air amplifier generating a flow of air when activated;
a heater coupled to the air amplifier, wherein the flow of air is heated when the heater is activated for processing in the plasma chamber;
a duct connected to an output of the heater;

a plenum disposed over a window of a plasma chamber, the plenum forms a partial enclosure having a top surface and side walls, the top surface having an inlet that couples to the duct for receiving the flow of air and an outlet that distributes the flow of air over a surface of the window of the plasma chamber;

a temperature sensor situated about the window of the plasma chamber; and a controller defined to activate the air amplifier and to activate the heater based on a temperature measured by the temperature sensor.

2. The semiconductor manufacturing apparatus as recited in claim 1, wherein the plenum includes a plurality of sections, wherein a first section includes the inlet that is coupled to the duct and other sections having respective inlets that couple to respective ducts, heaters and air amplifiers.

3. The semiconductor manufacturing apparatus as recited in claim 1, wherein the controller is defined to read instructions for a recipe in a computer readable medium, the instructions defining parameters for activating the air amplifier and the heater.

4. The semiconductor manufacturing apparatus as recited in claim 1, further including:
an inner coil above the window of the plasma chamber; and
an outer coil above the window of the plasma chamber.

5. The semiconductor manufacturing apparatus as recited in claim 4, wherein the plenum is ring shaped and disposed between the inner coil and the outer coil.

6. The semiconductor manufacturing apparatus as recited in claim 1,
wherein the plenum includes a plurality of segments arranged in a ring shape, and one of said plurality of segments includes the inlet and the outlet,
wherein other ones of said plurality of segments include respective inlets and outlets, such that the inlets are configured for coupling to respective ducts, air amplifiers, and heaters.

7. The semiconductor manufacturing apparatus as recited in claim 1, wherein the plenum is defined by a ring shape, the ring shape of the plenum includes the top surface and the side walls, the side walls include inner side walls and outer side walls and an open bottom that faces the window of the plasma chamber, the inner side walls include said outlet that is directed toward an center of said ring shape.

8. The semiconductor manufacturing apparatus as recited in claim 7, wherein the plenum includes a plurality of segments distributed around said ring shape, each one of the plurality of segments includes a respective inlet and a respective outlet, each respective inlet receives the flow of air from the air amplifier, and heater when activated, and outputs the flow of air over the window of the plasma chamber.

9. The semiconductor manufacturing apparatus as recited in claim 8, wherein the inlet of each segment is located radially opposite the outlet of said each segment, such that said flow of air delivered to each segment of the plenum moves within the segment and to the output of the segment, wherein a portion of the window under the segment is exposed to the flow of air while moving from the input to the output of the respective segment.

10. A semiconductor manufacturing apparatus comprising:
a plurality of air amplifiers coupled to pressurized gas, each air amplifier generating a flow of air when activated;
a plurality of heaters, each heater coupled to a respective air amplifier, wherein the flow of air is heated when each heater is activated during processing in a plasma chamber;
a plenum including a plurality of sections, wherein each section receives the flow of air from the respective air amplifier and each section distributes the flow of air over a window of the plasma chamber;
a plurality of ducts, each duct coupling the flow of air from an output of a respective one of the plurality of heaters to a respective one of the sections of the plenum, the plenum includes a plurality of inlets and a plurality of outlets, the inlets are disposed on a top surface of the plenum for coupling to respective ones of the plurality of ducts, the plenum having an open underside that enables delivery of the flow of air to regions of the window that reside under the plenum and the outlets of the plenum are oriented toward a center of the window;
one or more temperature sensors situated about the window of the plasma chamber; and
a controller defined to activate each air amplifier and activate each heater based on one or more temperatures measured by the one or more temperature sensors.

11. The semiconductor manufacturing apparatus as recited in claim 10 further including:
an inner coil above the window of the plasma chamber; and
an outer coil above the window of the plasma chamber, wherein the plenum is ring shaped and disposed between the inner coil and the outer coil.

12. A system, comprising:
a plasma chamber having a dielectric window disposed over a top of the plasma chamber;
a plenum disposed over the dielectric window, the plenum including a plurality of circular segments, each of the plurality of circular segments includes an inlet on a top surface of the plenum and an outlet;
a plurality of air amplifiers coupled to pressurized gas, each air amplifier generating a flow of air when activated;
a plurality of heaters, each heater coupled to the respective air amplifier, wherein the flow of air is heated when a respective heater is activated for processing in the plasma chamber;
a plurality of ducts, each duct coupling the flow of air from an output of a respective one of the plurality of heaters to respective inputs of the plurality of circular segments of the plenum, the plenum having an open underside that exposes the flow of air to regions of the dielectric window that reside under the plenum and the outlets of each one of the plurality of circular segments of the plenum are oriented toward a center of the dielectric window.

13. The system of claim 12, further comprising,
one or more temperature sensors situated about the dielectric window of the plasma chamber; and
a controller defined to activate each air amplifier and activate each heater based on one or more temperatures measured by the one or more temperature sensors.

14. The system of claim 12, wherein the plurality of circular segments define a ring shape.

15. The system of claim 12, further comprising,
an inner coil disposed above the dielectric window of the plasma chamber; and an outer coil disposed above the dielectric window of the plasma chamber, wherein the ring shape of the plenum is oriented between the inner coil and the outer coil.

16. The system of claim 12, wherein the plenum has side walls that include an inner side wall and an outer side wall between the open underside, the open underside faces the dielectric window, and said inner side wall includes the outlets of each respective one of the plurality of circular segments.

* * * * *